United States Patent
Dauzat et al.

(10) Patent No.: US 10,424,903 B2
(45) Date of Patent: Sep. 24, 2019

(54) ENCLOSURE FOR ELECTRICAL NETWORK PROTECTION ELEMENT

(71) Applicant: General Electric Company, Schenectady, NY (US)

(72) Inventors: Thomas Ambrose Dauzat, Shreveport, LA (US); Cecilia Espinoza, Nuevo Leon (MX); Luis Sanchez Cabral, Nuevo Leon (MX)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/845,047

(22) Filed: Dec. 18, 2017

(65) Prior Publication Data

US 2019/0190241 A1    Jun. 20, 2019

(51) Int. Cl.
| | | |
|---|---|---|
| H02B 1/32 | (2006.01) | |
| H02B 7/08 | (2006.01) | |
| H02J 3/14 | (2006.01) | |
| H05K 5/06 | (2006.01) | |
| H02B 1/38 | (2006.01) | |
| H02B 1/28 | (2006.01) | |

(52) U.S. Cl.
CPC .............. *H02B 7/08* (2013.01); *H02B 1/28* (2013.01); *H02B 1/32* (2013.01); *H02B 1/38* (2013.01); *H02J 3/14* (2013.01); *H05K 5/06* (2013.01)

(58) Field of Classification Search
None
See application file for complete search history.

(56) References Cited

U.S. PATENT DOCUMENTS

| | | | | |
|---|---|---|---|---|
| 7,871,137 | B2 * | 1/2011 | Schulz | H02B 1/28 312/296 |
| 9,352,639 | B2 * | 5/2016 | Fisher | B60J 5/0488 |
| 9,379,526 | B2 | 6/2016 | Bier et al. | |
| 10,136,567 | B2 * | 11/2018 | Anderson | H05K 9/0015 |
| 2012/0162862 | A1 * | 6/2012 | Cosley | H02B 1/42 361/644 |
| 2012/0194044 | A1 * | 8/2012 | Niedzwiecki | E05B 63/24 312/215 |
| 2013/0293076 | A1 * | 11/2013 | Karandikar | H02B 1/28 312/296 |
| 2015/0075080 | A1 * | 3/2015 | Ellingson | E06B 7/2309 49/483.1 |

(Continued)

*Primary Examiner* — Courtney L Smith
(74) *Attorney, Agent, or Firm* — Eversheds-Sutherland (US) LLP (57) ABSTRACT

The disclosure generally relates to an exemplary enclosure that protects an electrical network protection element in various environments such as when the enclosure is submerged in water or when the enclosure is placed in an underground vault that may be flooded during rain. The enclosure has a gasket that includes a first portion having a sloping surface which provides a continuously incremental amount of sealing in cooperation with a beveled edge of a door of the enclosure and a second portion having a flat surface which is compressed by a wedge projection in the door and provides water tight sealing as well. The enclosure includes a locking bar having a tapered portion, which moves into an opening in a flange of the enclosure and automatically creates a continuously incremental amount of pushing force upon the door against the gasket when a pivotable handle is operated for closing the door.

20 Claims, 8 Drawing Sheets

(56) References Cited

U.S. PATENT DOCUMENTS

| | | | |
|---|---|---|---|
| 2015/0282363 A1* | 10/2015 | Bier | H02B 1/38 |
| | | | 174/50.52 |
| 2016/0177603 A1* | 6/2016 | Sims | E05C 9/063 |
| | | | 292/101 |
| 2016/0241002 A1* | 8/2016 | Tremaine | H02B 1/44 |
| 2016/0374218 A1* | 12/2016 | Lakoduk | H02B 1/46 |
| 2018/0087302 A1* | 3/2018 | Hegner | E06B 1/526 |
| 2018/0139859 A1* | 5/2018 | Reese | H02B 1/38 |

* cited by examiner

ENCLOSURE FOR ELECTRICAL NETWORK PROTECTION ELEMENT

FIELD OF THE DISCLOSURE

This disclosure relates to enclosures, and more particularly, to an enclosure for housing an electrical network protection element.

BACKGROUND OF THE DISCLOSURE

An electrical protection element such as a circuit breaker or a fuse is typically used to protect a circuit, a device, or a system from being damaged due to an abnormal condition such as an over-voltage condition or an over-current condition. The characteristics of the electrical protection element are defined in large part by the nature of the application where the electrical protection element is used. Thus, a small fuse may be adequate to protect an electronic circuit board while a heavy-duty circuit breaker may be required to protect a transformer in an electric utility facility. Furthermore, the fuse used in the electronic circuit board may be selected without any undue attention being paid to a water-proofing aspect of the fuse. On the other hand, the heavy-duty circuit breaker may require specific attention to be paid to environmental factors such as temperature, humidity, and moisture, because the transformer may be exposed to natural elements such as the sun, rain, and snow. Consequently, in such applications, the electrical protection element may be placed inside a protective housing such as a utility hut or a water-proof enclosure.

In some cases, an electrical protection element may be housed inside a water-proof enclosure that is installed inside an underground structure. While it is expected that water would not normally flow into the underground structure, in some situations such as during heavy rainfall, water may enter the underground structure. The water-proof enclosure must therefore be constructed to prevent this water from coming in contact with the electrical protection element.

In some other cases, an electrical protection element may be housed inside a water-proof enclosure that is submerged under water, such as a body of water. Here again, the water-proof enclosure must be constructed to prevent water from coming in contact with the electrical protection element.

The water-proof enclosure must however, allow a person such as a technician, to open the water-proof enclosure in order to gain access to the electrical protection element for various reasons, such as to replace parts or to make a visual inspection of the electrical protection element. Consequently, such conflicting requirements should be taken into consideration when designing a water-proof enclosure. Some conventional solutions fail to satisfy at least some of these conflicting requirements, thereby exposing the electrical protection element to potential damage and/or making it difficult for a technician to access the electrical protection element.

BRIEF DESCRIPTION OF THE DISCLOSURE

Embodiments of the disclosure are directed generally to an enclosure for housing an electrical network protection element.

According to one exemplary embodiment of the disclosure, an enclosure can include a housing, a flange, a gasket, a door and a locking bar. The housing has an interior portion configured to accommodate an electrical network protection element and the flange is attached to the housing. The gasket is disposed in the flange and the door is hingeably attached to the flange. The locking bar, which is attached to the door, has a tapered portion configured to move into an opening in the flange when the door makes contact with the gasket. The pivotable handle is operatively coupled to the locking bar for moving the tapered portion of the locking bar into the opening in the flange, the tapered portion of the locking bar having a sloping surface that makes slideable contact with a portion of the opening thereby pushing the door against the gasket when the door makes contact with the gasket.

According to another exemplary embodiment of the disclosure, an enclosure can include a housing, a flange, a door, and a gasket. The housing has an interior portion configured to accommodate an electrical network protection element. The flange is attached to the housing, and the door is hingeably attached to the flange. The door has at least one side that includes a wedge projection extending towards the flange. The gasket is disposed in the flange and includes a first portion and a second portion. The first portion includes a sloping surface, the sloping surface arranged to compressibly engage with an edge portion of the door when the door is being closed. The second portion having a flat surface, the flat surface arranged to compressibly engage with the wedge projection of the door when the door is being closed.

According to yet another exemplary embodiment of the disclosure, an enclosure can include a housing, a flange, a door, a gasket, and a locking bar. The housing has an interior portion configured to accommodate an electrical network protection element. The flange is attached to the housing and the door is hingeably attached to the flange. The gasket is disposed in the flange. The locking bar, which is attached to the door, includes a tapered portion configured to move into an opening in the flange when the door makes contact with the gasket, the tapered portion having a sloping surface that makes slideable contact with a first portion of the opening to provide a leveraging action that pushes the door against the gasket to provide a sealed contact between the door and the flange.

Other embodiments and aspects of the disclosure will become apparent from the following description taken in conjunction with the following drawings.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION OF THE DISCLOSURE

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. For example, it should be understood that the phrase "electrical network protection element" as used herein generally refers to one or more of various types of elements such as a fuse, a circuit breaker, or a relay. Furthermore, the word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, described herein is an exemplary embodiment of an enclosure in accordance with the disclosure. The exemplary enclosure, which houses an electrical network protection element, provides protection to the electrical network protection element against damage in various environments such as when the enclosure is placed in an underground vault that may be flooded during rain, or when a liquid (oil, for example) comes in contact with the enclosure. The enclosure has a gasket that includes a first portion having a sloping surface which provides a continuously incremental amount of sealing in cooperation with a beveled edge of a door of the enclosure, a second portion having a flat surface which is compressed by a wedge projection in the door, and provides water tight sealing of the enclosure as well. The enclosure also has a locking mechanism that includes a locking bar having a tapered portion. The tapered portion moves into an opening in a flange of the enclosure and automatically creates a continuously incremental amount of force that pushes the door against both the first portion and the second portion of the gasket when a pivotable handle is operated for closing the door. A mechanical stop arrangement is also provided to prevent the door from over-compressing the first and second portions of the gasket.

Figure 1:
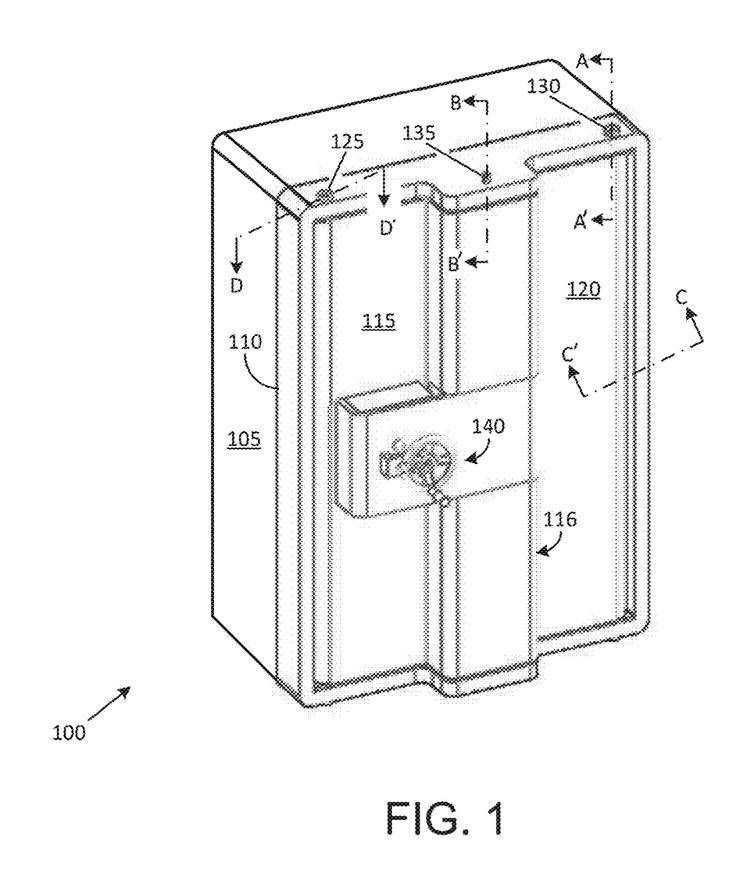
FIG. 1 shows a perspective view of an exemplary enclosure that can house an electrical network protection element in accordance with an exemplary embodiment of the disclosure.

FIG. 1 shows a perspective view of an exemplary enclosure 100 for an electrical network protection element (not shown), in accordance with an exemplary embodiment of the disclosure. The enclosure 100 is configured to provide waterproofing when completely submerged in water or when in contact with various types of liquids. The electrical network protection element is accommodated inside an interior portion of a housing 105 of the enclosure 100. In some implementations, air is evacuated from the interior portion of the housing 105 and replaced with an inert gas that helps prevent or minimize oxidation of various components of the electrical network protection element while also preventing or minimizing entry of water into the interior portion.

A flange 110 is attached to the housing 105 (by welding, for example) or can be manufactured as an integral part of the housing 105. A top portion of the flange 110 includes a first opening 125 and a second opening 130, each of which is configured for insertion of an attachment element such as a bolt, a screw, or a pin. A first attachment element inserted into the first opening 125 is used to attach a first door 115 to the flange 110. Similarly, a second attachment element inserted into the second opening 130 is used to attach a second door 120 to the flange 110. A bottom portion of the flange 110 includes a third attachment element (not shown) inserted into a third opening that is vertically aligned with the first opening for hingeably attaching the first door 115 to the flange 110. The first door 115 can be swung open or closed shut by using the combination of the first attachment element and the third attachment element. The bottom portion of the flange 110 further includes a fourth attachment element (not shown) inserted into a fourth opening that is vertically aligned with the second opening for hingeably attaching the second door 120 to the flange 110. The second door 120 can be swung open or closed shut by using the combination of the second attachment element and the fourth attachment element. Typically, in accordance with this exemplary embodiment, the second door 120 is closed first, followed by closing of the first door 115. A central lip portion 116 of the first door 115 overlaps a central edge portion of the second door 120 when the first door 115 is closed after closing of the second door 120.

A gasket (not shown) is disposed in the flange 110 for providing a water-tight seal when the first door 115 and the second door 120 are placed in a closed position. The gasket is made of a compressible material, such as rubber, and may include several portions that may be independent of each other or may be constituent parts of a unitary gasket. In one exemplary implementation, the gasket includes a first portion that is disposed along a top horizontal section of the flange 110 and is operative as a watertight seal that prevents or minimizes water from entering the housing 105 via the top edges of the first door 115 and the second door 120. The first portion, which extends substantially along an entire width of the top horizontal section of the flange 110, can include a sloping surface that comes in compressible contact with the top edges of the first door 115 and the second door 120 when the two doors are placed in a closed position. In one exemplary implementation, the top edges of the first door 115 and the second door 120 can be beveled edges having a slope that matches a slope of the sloping surface of the first portion of the gasket.

The gasket may include a second portion that is a first channel gasket disposed in a channel that extends along a first vertical edge of the flange 110. The first channel gasket, which extends substantially along an entire length of the first vertical edge of the flange 110 (left side vertical edge in FIG. 1), is operative as a watertight seal that prevents or minimizes water from entering the housing 105 via an outer vertical edge of the first door 115.

The gasket may include a third portion that is a second channel gasket disposed in a channel that extends along a second vertical edge of the flange 110. The second channel gasket, which extends substantially along an entire length of the second vertical edge of the flange 110 (right side vertical edge in FIG. 1), is operative as a watertight seal that prevents or minimizes water from entering the housing 105 via an outer vertical edge of the second door 120.

The gasket may include a fourth portion that is disposed along a bottom horizontal edge of the flange 110 and is operative as a watertight seal that prevents or minimizes water from entering the housing 105 via the bottom edges of the first door 115 and the second door 120. The fourth portion, which extends substantially along an entire width of the bottom horizontal section of the flange 110, can include a sloping surface that comes in compressible contact with the bottom edges of the first door 115 and the second door 120 when the two doors are placed in a closed position.

The flange 110 further includes a central opening 135 configured to accept entry of a locking bar (not shown) when a pivotable handle 140 is operated after the central lip portion 116 of the first door 115 is placed in overlapping contact with the central portion of the second door 120. Further details of the locking bar and other elements of the enclosure 100 will be provided below using other figures.

Figure 2:
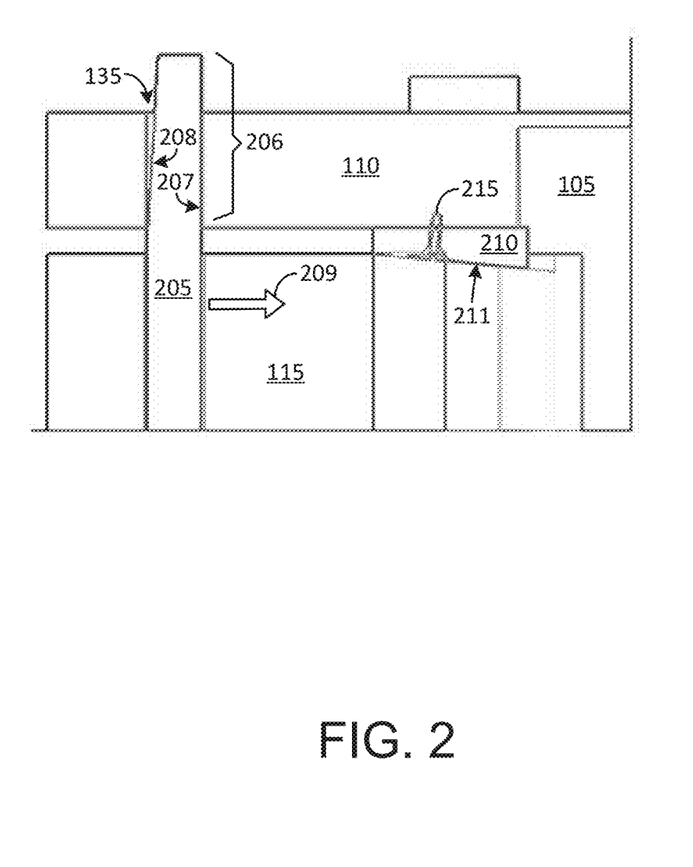
FIG. 2 shows a cross-sectional view of a central portion of the exemplary enclosure shown in FIG. 1.

FIG. 2 shows a cross-sectional view of a central portion of the exemplary enclosure 100. This cross-sectional view, which is indicated by the B-B' arrows in FIG. 1, provides some details about a locking bar 205 that can be used to lock and seal the first door 115 and the second door 120 after the central lip portion 116 of the first door 115 is placed in overlapping contact with the central portion of the second door 120. The locking bar 205 includes a tapered portion 206 that is configured to move upwards into the central opening 135 in the flange 110 (or downwards and out of the central opening 135) when the pivotable handle 140 is manually operated by a technician, for example. In this exemplary embodiment, the tapered portion 206 includes a flat surface 207 that faces a first side of the central opening 135 and a sloping surface 208 that faces an opposing second side of the central opening 135. The opposing second side of the central opening 135 is closer to a front external surface of the first door 115 than the first side of the central opening 135.

The flat surface 207 operates cooperatively with the sloping surface 208 as the locking bar 205 moves upwards into the central opening 135, to provide a cantilever action that pushes the locking bar 205 against the first door 115 and moves the first door 115 in the direction indicated by the arrow 209. The sloping surface 208 can have one of a linear or a non-linear profile and in one exemplary implementation, the central opening 135 in the flange 110 can be a rectangular opening. In other exemplary embodiments, the central opening 135 can have other shapes. The sloping surface 208 makes slideable contact with one side of the rectangular opening while the flat surface 207 makes slideable contact with an opposing second side of the rectangular opening when the door makes contact with the gasket. The opposing second side of the rectangular opening located closer to the housing than the first side of the rectangular opening. In other exemplary implementations, the tapered portion 206 can be substantially conical in shape or can conform to any other shape that provides the sloping surface 208, and the central opening 135 can be one of a square opening, an oval opening, or a trapezoidal opening.

Upon moving in the direction indicated by the arrow 209, the first door 115 comes in contact with the gasket that is disposed in the flange 110. More particularly, in the cross-sectional view shown in FIG. 2, the first door 115 comes in contact with a first portion 210 of the gasket that is attached to the flange 110. In this exemplary implementation, the first portion 210 of the gasket is attached to the flange 110 by utilizing a set of screws (indicated by a screw 215). In other exemplary implementations, the first portion 210 of the gasket may be placed inside a slot in the flange 110 and/or attached to the flange 110 by utilizing other elements such as one or more rivets, one or more pins, or an adhesive. The first portion 210 of the gasket extends substantially along an entire width of the top horizontal section of the flange 110 and includes a sloping surface 211 that comes in contact with the top edge of the first door 115 when the first door 115 is placed in a closed position.

In one exemplary implementation, the top edge of the first door 115 has a sloping surface that conforms to the sloping surface 211 so as to avoid damaging the first portion 210 of the gasket. Such damage may occur for example if the top edge of the first door 115 has an orthogonal shape with a sharp corner that penetrates the first portion 210 of the gasket. The sloping surface 211 of the first portion 210 of the gasket has a positive slope characteristic that provides for an increase in thickness of the gasket in a direction towards the housing 105. Accordingly, a relatively narrow front portion of the sloping surface 211 faces the first door 115 and a relatively wider rear portion of the sloping surface 211 is located closer to a back wall of the housing 105.

As described above, the tapered portion 206 of the locking bar 205 is configured to move upwards into the central opening 135 in the flange 110 when the pivotable handle 140 is manually operated, thereby moving the first door 115 in the direction indicated by the arrow 209. The sloping surface 208 of the locking bar 205 has a slope that is selected to provide a continuously incremental amount of pushing force upon the first door 115. The continuously incremental amount of pushing force is in direct proportion to a depth of insertion of the tapered portion 206 of the locking bar 205 into the central opening 135 in the flange 110. The sloping surface 211 of the first portion 210 of the gasket is arranged to provide a continuously incremental amount of sealing in cooperation with the top edge of the first door 115.

Though the description provided above is with respect to a cross-sectional view of a central portion of the exemplary enclosure 100, the structural and operational characteristics of the first portion 210 of the gasket and the top edge of the first door 115 is equally applicable to the entire width of the top horizontal section of the flange 110 and to the fourth portion of the gasket that is disposed along a bottom horizontal edge of the flange 110 and is operative as a watertight seal that prevents or minimizes water from entering the housing 105 via the bottom edges of the first door 115 and the second door 120. It must be understood that the central lip portion 116 of the first door 115, which overlaps a central portion of the second door 120, pushes the second door 120 towards the first portion 210 of the gasket (and the fourth portion of the gasket) when the tapered portion 206 of the locking bar 205 moves upwards into the central opening 135 in the flange 110.

Figure 3:
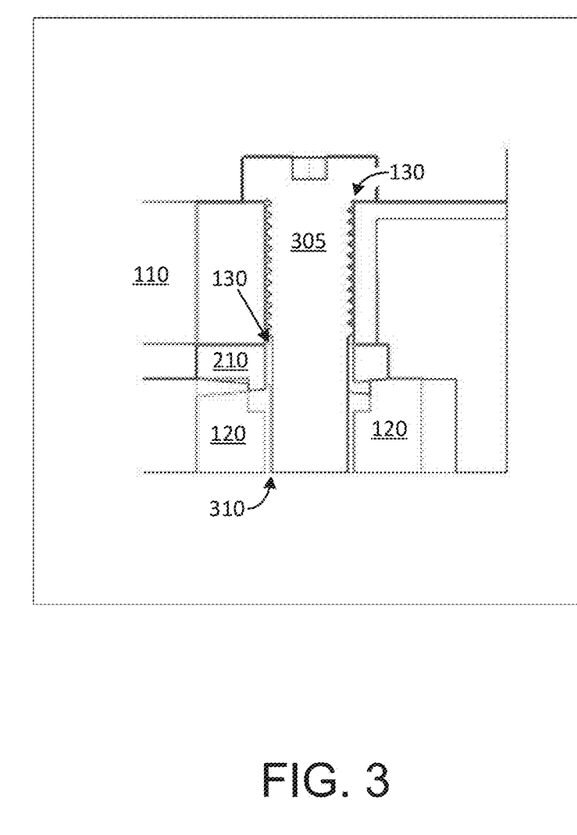
FIG. 3 shows a cross-sectional view of a hinged portion of the exemplary enclosure shown in FIG. 1.

FIG. 3 shows a cross-sectional view of a hinged portion of the exemplary enclosure 100, the hinged portion associated with the second door 120. It must be understood that the description is equally applicable to the corresponding hinged portion associated with the first door 115. This cross-sectional view, which is indicated by the A-A' arrows in FIG. 1, provides some details about an attachment element 305 such as a bolt, a pin, or a screw for hingeably attaching the second door 120 to the flange 110. The attachment element 305 is arranged to pass through the opening 130 located in the top portion of the flange 110 and through the first portion 210 of the gasket that is disposed along the top horizontal section of the flange 110. The attachment element 305 is further arranged to pass into an opening 310 in the second door 120. The attachment element 305 can be held in place by various ways, such as by a locking nut or a screw thread provided in the flange 110 and/or the second door 120.

Figure 4:
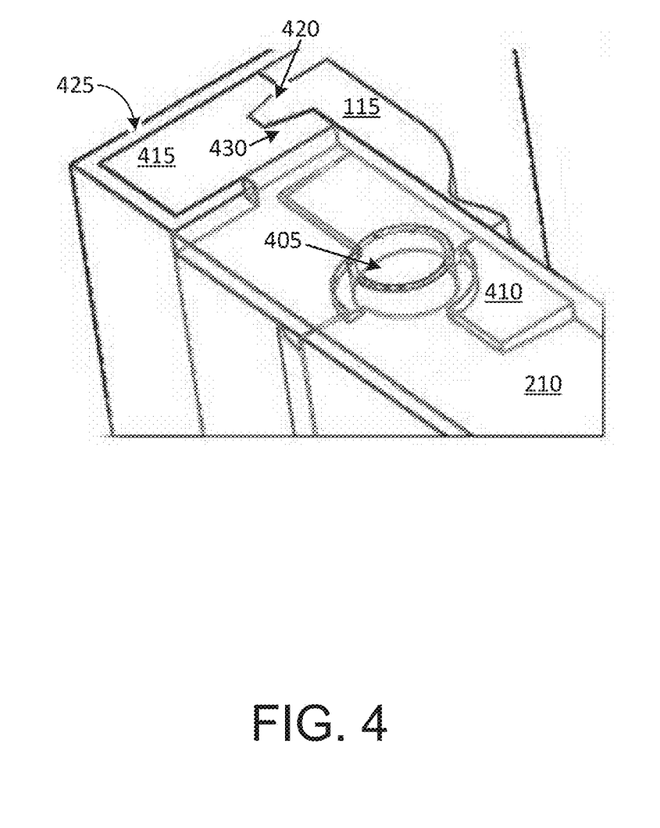
FIG. 4 shows a perspective view of a hinged portion of the exemplary enclosure shown in FIG. 1.

FIG. 4 shows a perspective view of a hinged portion of the exemplary enclosure 100, the hinged portion associated with the first door 115. It must be understood that the description is equally applicable to the corresponding hinged portion associated with the second door 120. This cross-sectional view, which is indicated by the D-D' arrows in FIG. 1, provides some details of a channel gasket 415 disposed in a channel 425 of the flange 110, and also of an opening 405 that is provided for insertion of an attachment element (not shown) such as a bolt, a pin, or a screw for hingeably attaching the first door 115 to the housing 105.

The channel 425 extends substantially along an entire height of a first vertical section of the flange 110, and the channel gasket 415 that is disposed in the channel 425 is operative as a watertight seal that prevents or minimizes water from entering the housing 105 via the outer edge of the first door 115. Not shown is a substantially similar channel gasket that is disposed in a substantially similar channel extending along a second vertical section of the flange 110 and is operative as a watertight seal that prevents or minimizes water from entering the housing 105 via the outer edge of the second door 120.

A wedge projection 420 of the first door 115 makes initial contact with a flat surface of the channel gasket 415 as the first door 115 is placed in a closed position. The wedge projection 420, which extends substantially along the entire length of a vertical edge portion of the first door 115, then compressibly pushes against the flat surface of the channel gasket 415 when the locking bar 205 moves upwards into the central opening 135. The compressed contact between the wedge projection 420 and the channel gasket 415 operates as a water tight seal that prevents or minimizes water from entering the enclosure 100 via a vertical edge of the first door 115. In this exemplary implementation, the amount of compression is limited by a protruding portion 430 of the flange 110 that prevents the wedge projection 420 of the first door 115 from penetrating beyond a preselected distance into the channel gasket 415. The preselected distance, which constitutes a mechanical stop, can be defined by one or more dimensions of the protruding portion 430.

The opening 405 extends through the first portion 210 of the gasket. As described above, the sloping surface 211 has a positive slope characteristic that provides for an increase in thickness of the gasket in a direction towards the housing 105. Accordingly, a narrow front portion of the sloping surface 211 is located closer to the first door 115 than a thicker rear portion of the sloping surface 211 that is located closer to the housing 105. A secondary gasket portion 410 is mounted on top of the first portion 210 of the gasket or can be fabricated as an integral part of the first portion 210. In this exemplary embodiment, the secondary gasket portion 410 includes a semicircular cut-out that faces away from the first door 115 and towards the housing 105. The semicircular cutout is configured to allow the attachment element to pass through the opening 405 and into the first door 115. The secondary gasket portion 410 has a slope that is opposite to the slope of the first portion 210 of the gasket. Accordingly, a relatively narrow front portion of the secondary gasket portion 410 is located closer to the housing 105 than a relatively thicker rear portion that is located closer to the first door 115.

Figure 5:
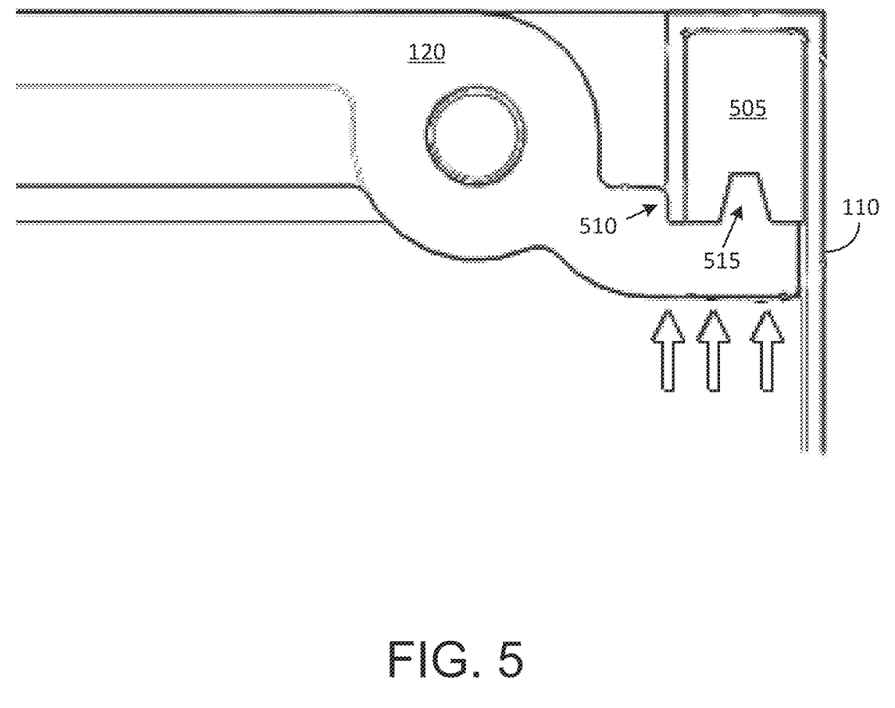
FIG. 5 shows a cross-sectional view of a portion of a flange of the exemplary enclosure shown in FIG. 1.

FIG. 5 shows a cross-sectional view of a portion of a channel gasket 505 disposed in a channel that extends along the second vertical section of the flange 110. This cross-sectional view is indicated by the C-C' arrows in FIG. 1. A wedge projection 515, which extends substantially along the entire length of a vertical edge portion of the second door 120 makes initial contact with the channel gasket 505 as the second door 120 is placed in a closed position. The wedge projection 515 compressibly pushes against a flat surface the channel gasket 505 when the locking bar 205 moves upwards into the central opening 135. The compressed contact between the wedge projection 515 and the channel gasket 505 operates as a water tight seal that prevents or minimizes water from entering the enclosure 100 via the outside edge of the second door 120. In this exemplary implementation, the amount of compression is limited by a protruding portion 510 of the flange 110 that prevents the wedge projection 515 of the second door 120 from penetrating beyond a preselected distance into the channel gasket 505. The preselected distance can be defined by one or more dimensions of the protruding portion 510.

Figure 6:
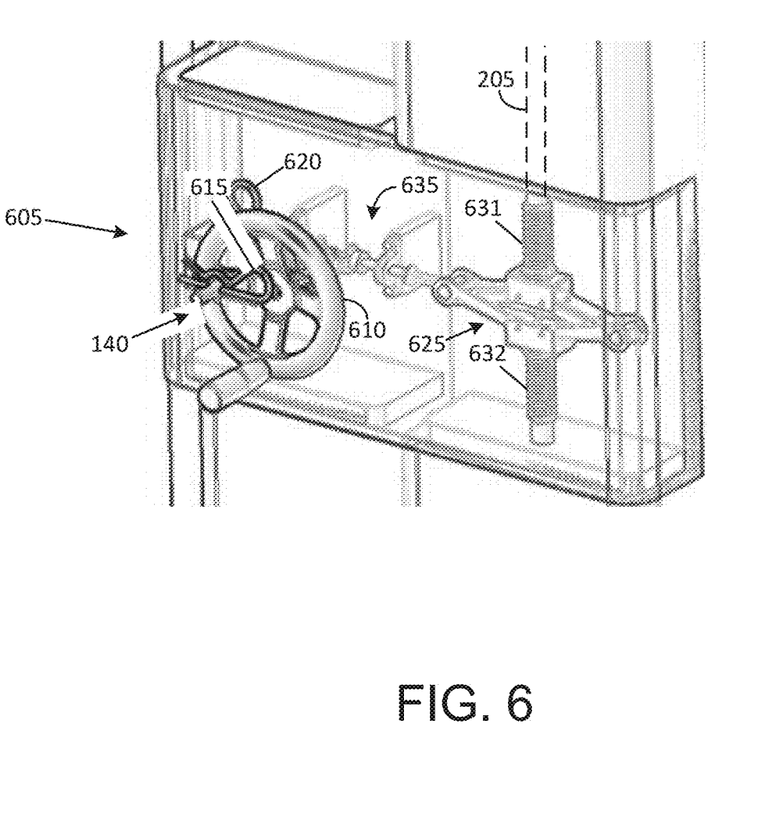
FIG. 6 shows a first internal view of a locking assembly of the exemplary enclosure shown in FIG. 1.
Figure 7:
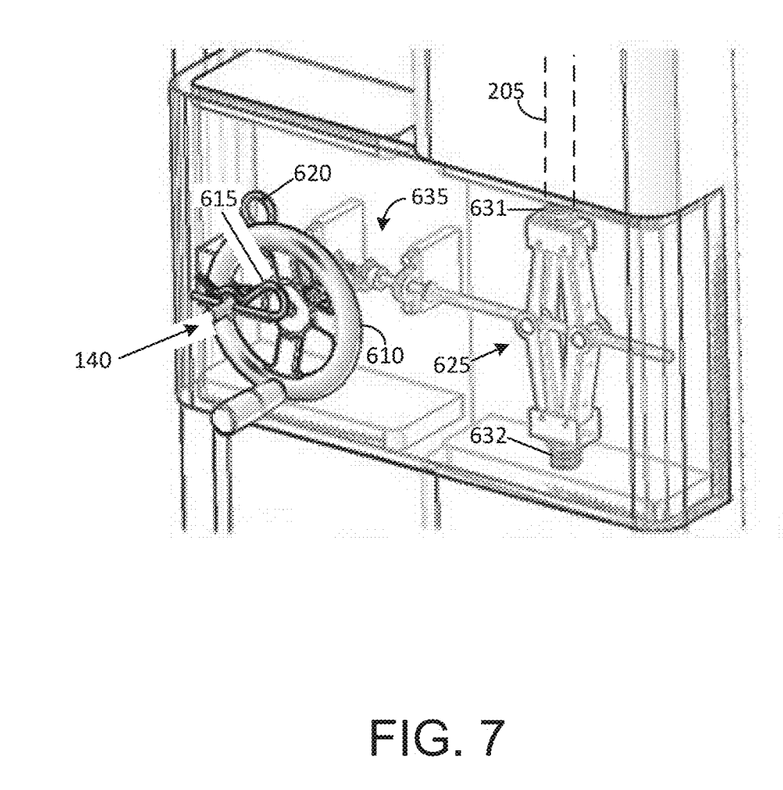
FIG. 7 shows a second internal view of the locking assembly of the exemplary enclosure shown in FIG. 1.

FIG. 6 shows a first internal view of the first door 115, specifically a locking assembly 605 that is attached to the first door 115. FIG. 7 shows a second internal view of the locking assembly 605. The locking assembly 605 includes the pivotable handle 140, which can be used to lock the first door 115 and the second door 120 after the two doors are placed in a closed condition. The locking operation moves the locking bar 205 into the central opening 135 thereby pushing the first door 115 against the second door 120. When the first door 115 is pushed against the second door 120, both the first door 115 and the second door 120 are pushed against the gasket to provide a watertight seal that prevents or minimizes water from entering the housing 105 of the enclosure 100 via any of the edges of the first door 115 and the second door 120.

The pivotable handle 140 includes a wheel 610 in this exemplary embodiment. In another exemplary embodiment, the pivotable handle 140 can include a lever. The wheel 610, which includes a handle for holding by an operator, operates in cooperation with a gear arrangement 635 to transfer a rotary motion of the wheel 610 to a scissor jack 625. The scissor jack 625 is coupled to the locking bar 205, which moves linearly upwards (or downwards) when the scissor jack 625 is activated via the action of the gear arrangement 635. The vertical movement of the locking bar 205 may be assisted by one or more springs, such as a first spring 631 and a second spring 632 that are coupled to the scissor jack 625 and/or first door 115. FIG. 6 shows the scissor jack 625 in a lowered position wherein the locking bar 205 has not yet entered the central opening 135 in the flange 110. FIG. 7 shows the scissor jack 625 in a raised position wherein the locking bar 205 has entered the central opening 135 in the flange 110.

If left unconstrained in the raised position, the scissor jack 625 has a tendency to revert to the lowered position as a result of gravity and/or as a result of spring potential energy. When reverting from the raised position to the lowered position, the downward movement of the scissor jack 625 will be transferred to the gear arrangement 635, which in turn will make the wheel 610 rotate in an opposite direction to the direction taken to raise the scissor jack 625 to the raised position. Thus, when the wheel 610 is rotated in a clockwise direction to place the scissor jack 625 in the raised position, gravity and/or spring potential energy has a tendency to make the wheel 610 rotate in a counter-clockwise direction and move the scissor jack back to the lowered position. This undesirable action due to gravity and/or spring potential energy can be prevented by using one or more locking pins, such as a first cotter pin 615 and a second cotter pin 620 that can be used to lock the wheel 610 after the scissor jack 625 is placed in the raised position.

Figure 8:
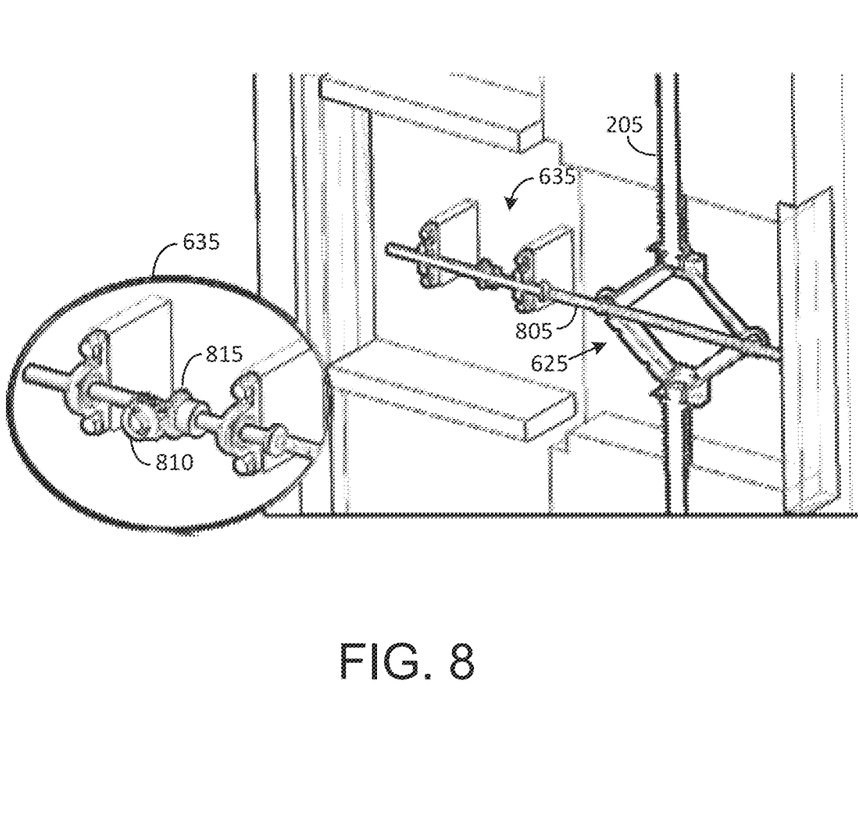
FIG. 8 shows a third internal view and detailed view of the locking assembly of the exemplary enclosure shown in FIG. 1.

FIG. 8 shows a detailed or close-up view of the gear arrangement 635 that is used to transfer the rotary motion of the wheel 610 to the scissor jack 625. As described above, the scissor jack 625 operates to provide a linear upwards movement of the locking bar 205 into the central opening 135 in the flange 110. The gear arrangement 635 can include two or more beveled gears such as a first beveled gear 810 that cooperates with a second beveled gear 815. The two or more beveled gears are utilized to translate a rotation of the wheel 610 in one axis to a rotation of a threaded rod 805 in an orthogonal axis, wherein the orthogonal axis coincides with a longitudinal axis of the threaded rod 805. The rotation of the threaded rod 805 operates the scissor jack 625 to move the locking bar 205 upwards or downwards based on the direction of the rotation.

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. An enclosure comprising:
   a housing having an interior portion configured to accommodate an electrical network protection element;
   a flange attached to the housing;
   a gasket disposed in the flange;
   a door hingeably attached to the flange;
   a locking bar attached to the door, the locking bar having a tapered portion configured to move into an opening in the flange when the door makes contact with the gasket; and
   a pivotable handle operatively coupled to the locking bar for moving the tapered portion of the locking bar into the opening in the flange, the tapered portion of the locking bar having a sloping surface that makes slideable contact with a portion of the opening thereby pushing the door against the gasket when the door makes contact with the gasket.

2. The enclosure of claim 1, wherein the gasket comprises a first portion that includes a sloping surface, the sloping surface arranged to provide a continuously incremental amount of sealing in cooperation with a first portion of the door when the door is being closed.

3. The enclosure of claim 2, wherein the first portion of the gasket is disposed along at least one of a top horizontal section of the flange or a bottom horizontal section of the flange, and wherein the gasket further comprises a second portion having a flat surface, the flat surface arranged to provide a sealed joint in cooperation with a second portion of the door when the door is closed, the second portion of the door comprising a wedge projection configured to compressibly engage with the flat surface of the gasket.

4. The enclosure of claim 3, wherein the second portion of the gasket is a channel gasket that is housed in at least one vertical portion of the flange, the at least one vertical portion of the flange including a projecting portion that stops the door to avoid over-compressing the first portion of the gasket disposed along the at least one of the top horizontal section of the flange or the bottom horizontal section of the flange.

5. The enclosure of claim 4, further comprising:
   one of a bolt, a pin, or a screw for hingeably attaching the door to the housing, the one of the bolt, the pin, or the screw arranged to pass through an opening in the first portion of the gasket that is disposed along the at least one of the top horizontal section of the flange or the bottom horizontal section of the flange.

6. The enclosure of claim 1, wherein the sloping surface of the locking bar has a slope that is selected to provide a continuously incremental amount of pushing force upon the door, wherein the continuously incremental amount of pushing force is in direct proportion to a depth of insertion of the tapered portion of the locking bar into the opening in the flange.

7. The enclosure of claim 1, wherein the pivotable handle comprises a wheel that is operatively coupled to the locking bar for translating a rotary motion of the wheel to a linear movement of the locking bar into the opening in the flange.

8. An enclosure comprising:
   a housing having an interior portion configured to accommodate an electrical network protection element;
   a flange attached to the housing;
   a door hingeably attached to the flange, the door having at least one side that includes a wedge projection extending towards the flange; and
   a gasket disposed in the flange, the gasket comprising:
     a first portion extending horizontally along an upper horizontal section of the flange, wherein the first portion includes a sloping surface, the sloping surface arranged to compressibly engage with a sloped edge portion of the door along an upper horizontal section of the door when the door is being closed; and
     a second portion extending vertically along a vertical portion of the flange, wherein the second portion comprises a flat surface, the flat surface arranged to compressibly engage with the wedge projection of the door along a vertical edge of the door when the door is being closed.

9. The enclosure of claim 8, further comprising:
   a locking bar having a tapered portion configured to move into an opening in the flange when the door makes contact with the gasket; and
   a pivotable handle operatively coupled to the locking bar for moving the tapered portion of the locking bar into the opening in the flange, the tapered portion of the locking bar having a sloping surface that makes slideable contact with a first portion of the opening to provide a leveraging action for pushing the door against the gasket.

10. The enclosure of claim 9, wherein the sloping surface of the locking bar has a slope that is selected to provide a continuously incremental amount of force to push the door against the gasket in direct proportion to a depth of insertion of the tapered portion of the locking bar into the opening in the flange.

11. The enclosure of claim 10, wherein the sloping surface of the locking bar has one of a linear or a non-linear profile.

12. The enclosure of claim 11, wherein the opening is one of a square opening, a rectangular opening, an oval opening, or a trapezoidal opening.

13. The enclosure of claim 12, further comprising a scissor jack configured to operatively couple a wheel to the locking bar for translating a rotary motion of the wheel to a linear movement of the locking bar.

14. An enclosure comprising:
a housing having an interior portion configured to accommodate an electrical network protection element;
a flange attached to the housing;
a door hingeably attached to the flange;
a gasket disposed in the flange; and
a locking bar attached to the door, the locking bar including a tapered portion configured to move into an opening in the flange when the door makes contact with the gasket, the tapered portion having a sloping surface that makes slideable contact with a first portion of the opening to provide a cantilever action that pushes the door against the gasket to provide a sealed contact between the door and the flange.

15. The enclosure of claim 14, wherein the gasket comprises:
a first portion that includes a sloping surface, the sloping surface arranged to engage with a first portion of the door when the door is closed; and
a second portion having a flat surface, the flat surface arranged to engage with a second portion of the door when the door is closed, the second portion of the door having a wedge projection configured to compressibly engage with the flat surface of the gasket.

16. The enclosure of claim 15, further comprising:
a pivotable handle operatively coupled to the locking bar for moving the tapered portion of the locking bar into the opening in the flange when the door makes contact with the gasket.

17. The enclosure of claim 16, wherein the pivotable handle comprises a wheel that is operatively coupled to the locking bar for translating a rotary motion of the wheel to a linear movement of the locking bar into the opening in the flange.

18. The enclosure of claim 17, further comprising a scissor jack configured to operatively couple the wheel to the locking bar for translating the rotary motion of the wheel to the linear movement of the locking bar.

19. The enclosure of claim 15, wherein the sloping surface has one of a linear or a non-linear profile, wherein the opening is a rectangular opening, and wherein the first portion of the opening is a first side of the rectangular opening.

20. The enclosure of claim 19, wherein the locking bar further includes a flat surface that makes slideable contact with an opposing second side of the rectangular opening when the door makes contact with the gasket, the opposing second side of the rectangular opening located closer to the housing than the first side of the rectangular opening.

* * * * *